United States Patent [19]
Woo et al.

[11] Patent Number: 5,210,047
[45] Date of Patent: May 11, 1993

[54] PROCESS FOR FABRICATING A FLASH EPROM HAVING REDUCED CELL SIZE

[76] Inventors: Been-Jon K. Woo, 20675 Woodward Ct., Saratoga, Calif. 95070; Gregory Atwood, 2495 Marsha Way, San Jose, Calif. 95132; Stefan K. C. Lai, 2613 Lincoln Ave., Belmont, Calif. 94002; T. C. Ong, 1820 Mayall Ct., San Jose, Calif. 95132

[21] Appl. No.: 809,282

[22] Filed: Dec. 12, 1991

[51] Int. Cl.⁵ .......................................... H01L 21/266
[52] U.S. Cl. ............................ 437/43; 148/DIG. 19; 148/DIG. 50
[58] Field of Search ............. 437/30, 42, 43, 49, 437/63, 192, 200, 915, 978; 148/DIG. 19, DIG. 20, DIG. 50, DIG. 147; 357/23.5

[56] References Cited

U.S. PATENT DOCUMENTS

| | | | |
|---|---|---|---|
| 4,698,787 | 10/1987 | Mukherjee et al. | 357/23.5 |
| 4,868,619 | 9/1989 | Mukherjee et al. | 357/23.5 |
| 5,019,527 | 5/1991 | Ohshima et al. | 437/43 |
| 5,110,753 | 5/1992 | Gill et al. | 437/43 |

OTHER PUBLICATIONS

"Titanium Disilicide Self-Aligned Source/Drain & Gate Technology," by Lau et al. IEDM, 1982.
"LPCVD Titanium Nitride—Deposition, Properties, and Application to ULSI" by Pintochovski et al., Materials Research Society, 1989.
"Microstructure and Electrical Properties of Titanium Nitride Diffusion Barrier Films Sputtered from a Composite Target," by Wei et al., Materials Research Society, 1989.
"Titanium Nitride Deposition in a Cold Wall CVD Reactor," by A. Sherman, Materials Research Society, 1989.
"A 3.6 mm² Memory Cell Structure for 16MB EPROMS," by Hisamune et al., IEDM 1989, pp. 583–586.

Primary Examiner—Brian E. Hearn
Assistant Examiner—C. Chaudhari

[57] ABSTRACT

A process for fabricating an electrically programmable read-only memory array having increased density includes forming recessed field oxide regions in a silicon substrate. Elongated parallel wordline stacks are then formed over the surface of the substrate. Source and drain regions are formed by ion implantation in the openings between these vertical stacks. These openings are then filled with a metal layer until the wafer is substantially planar. This metal layer is then patterned to form drain contact pads and $V_{SS}$ interconnect strips. The $V_{SS}$ interconnect strips contact adjacent source regions across field oxide regions that insulate adjacent memory cells.

16 Claims, 5 Drawing Sheets

FIG_1 (PRIOR ART)
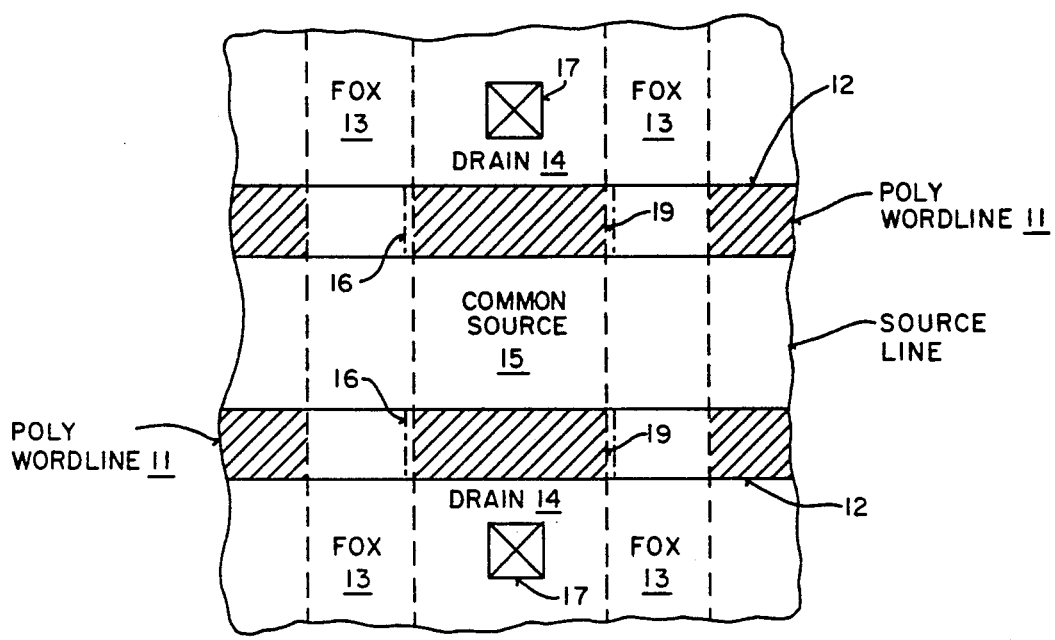
FIG_2
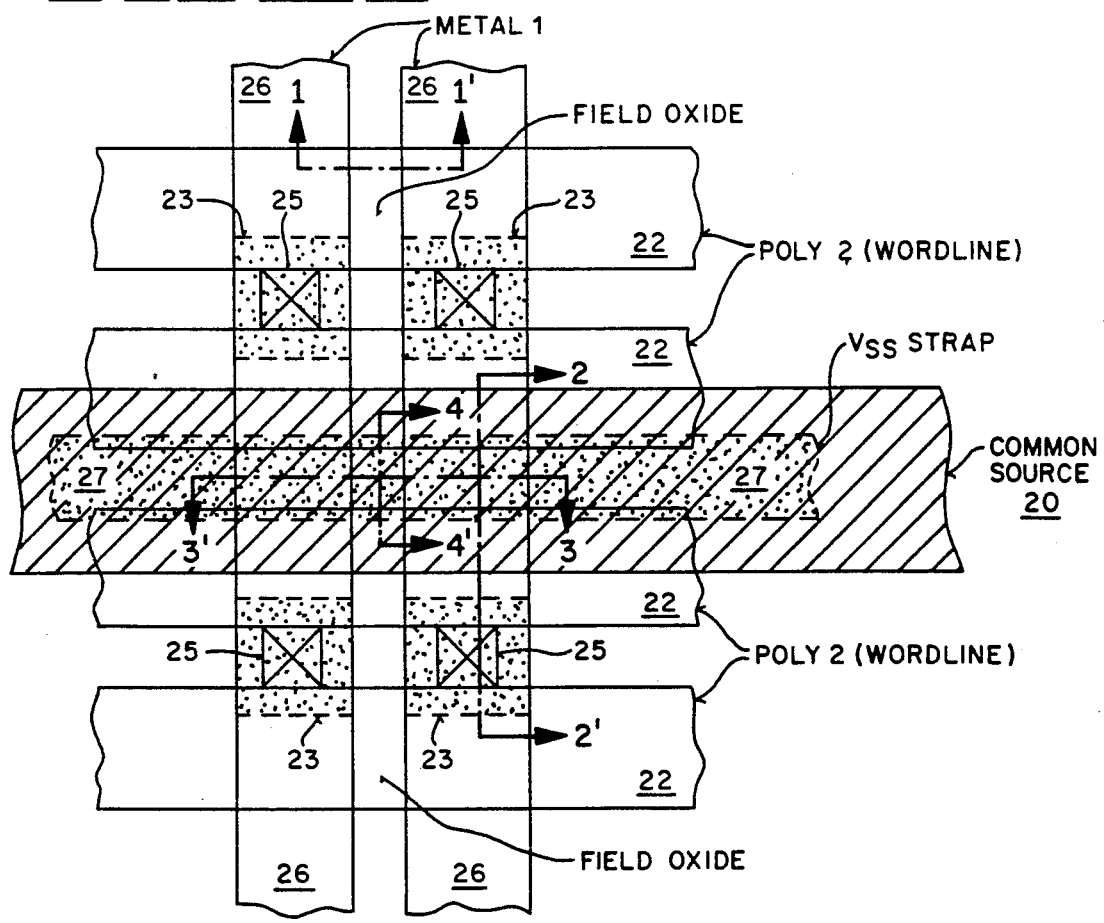

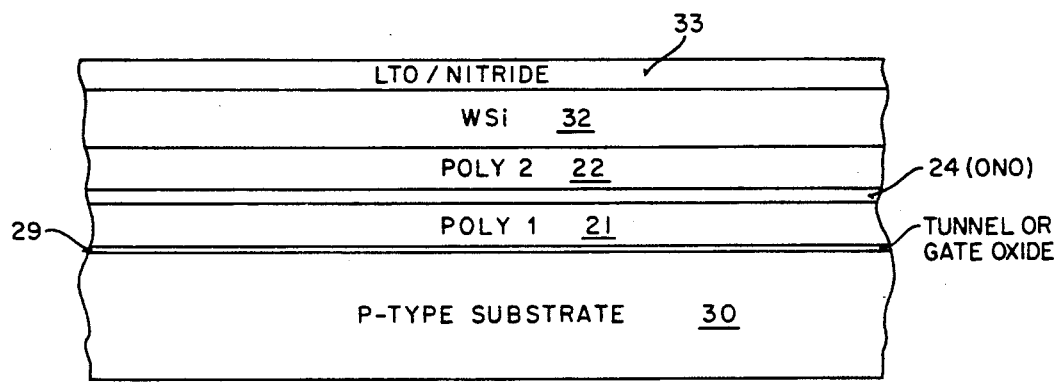
FIG_3
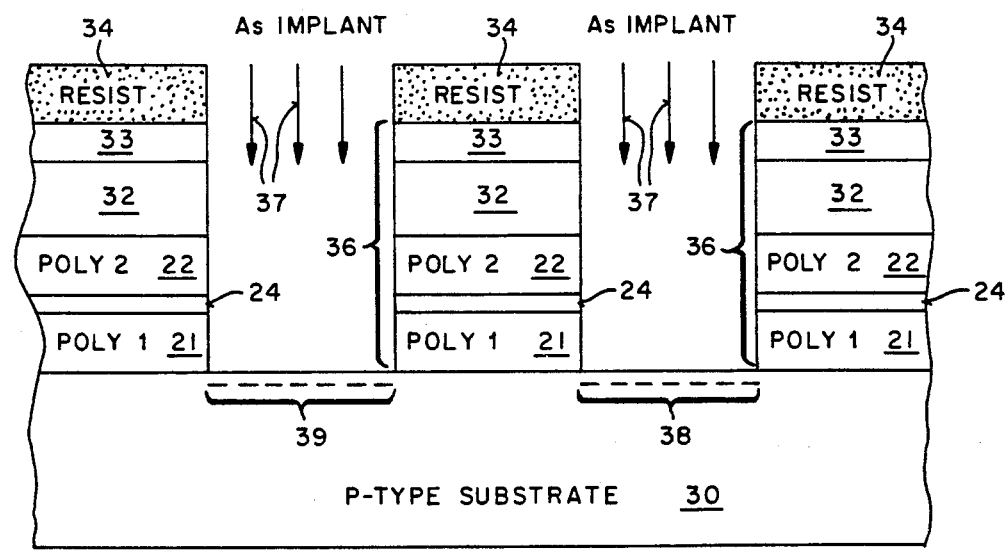
FIG_4

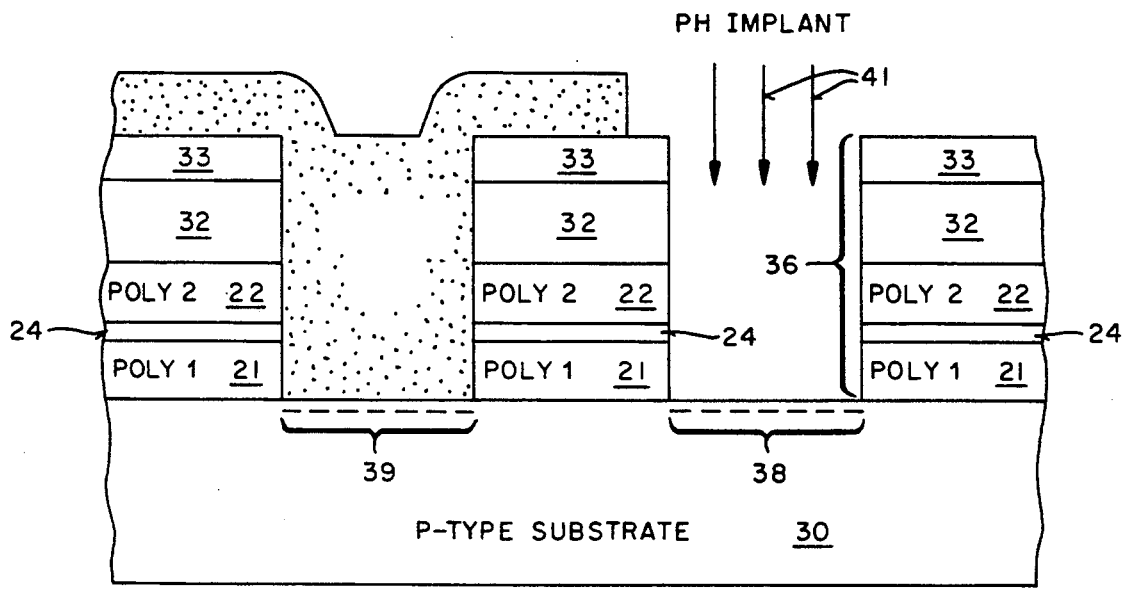
FIG_5
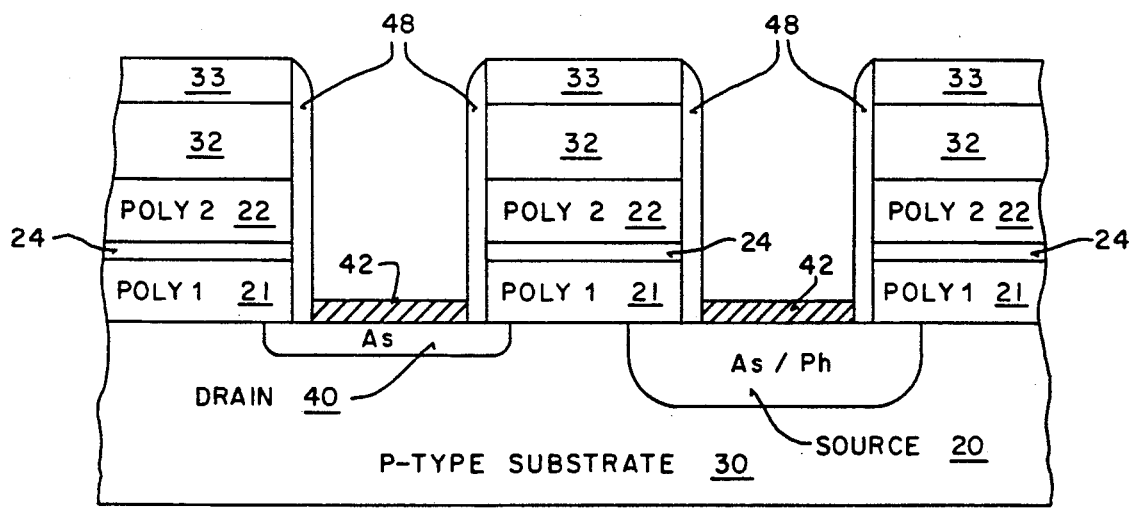
FIG_6

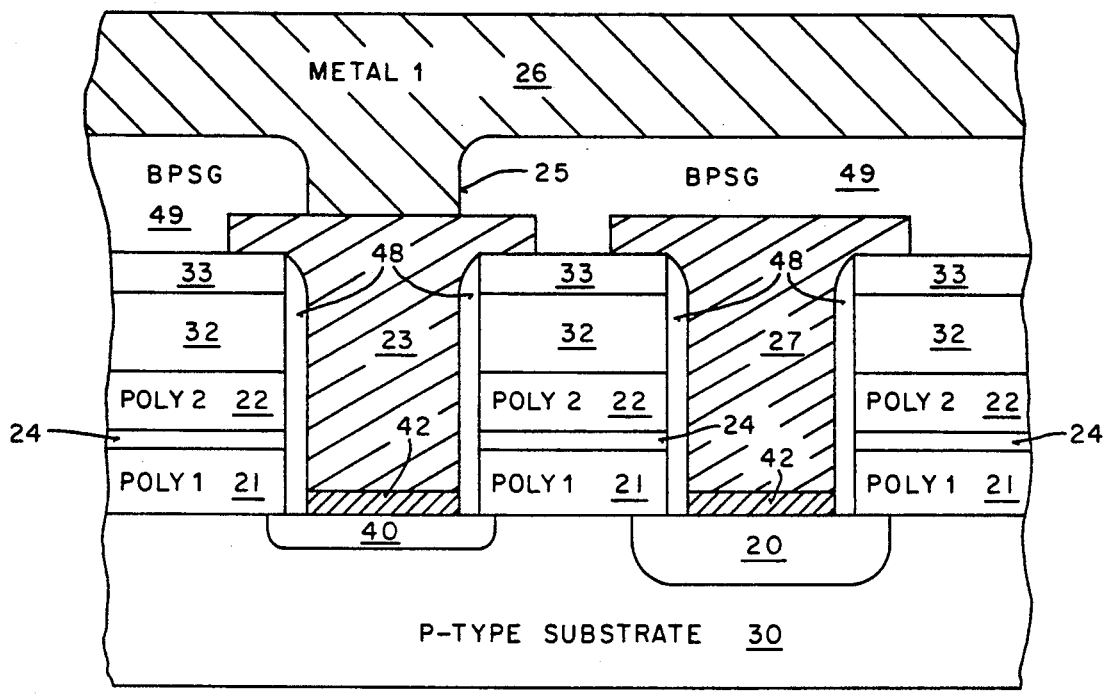
FIG_7
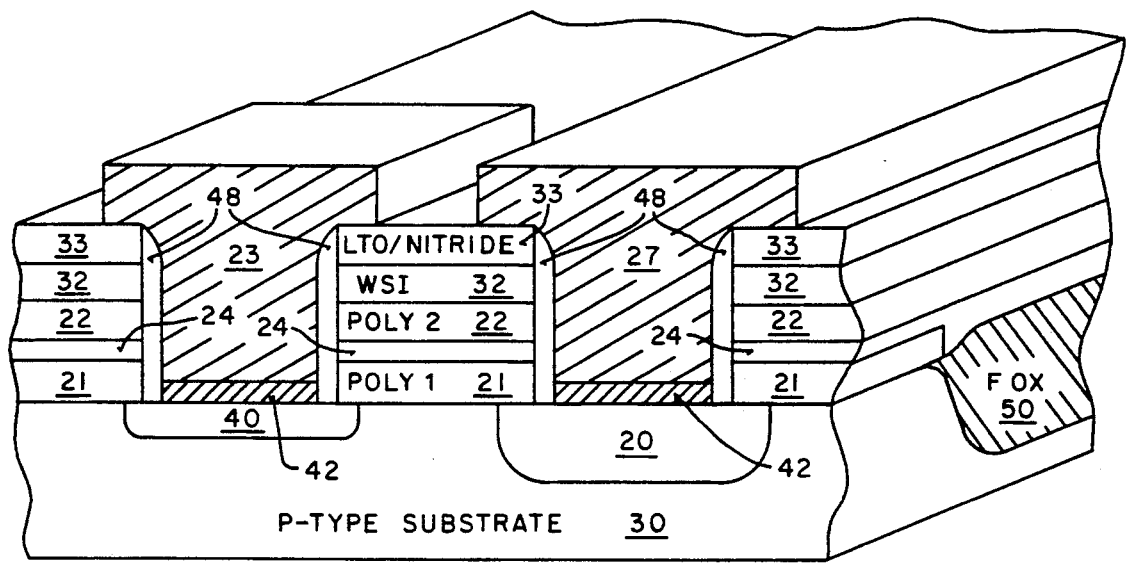
FIG_8

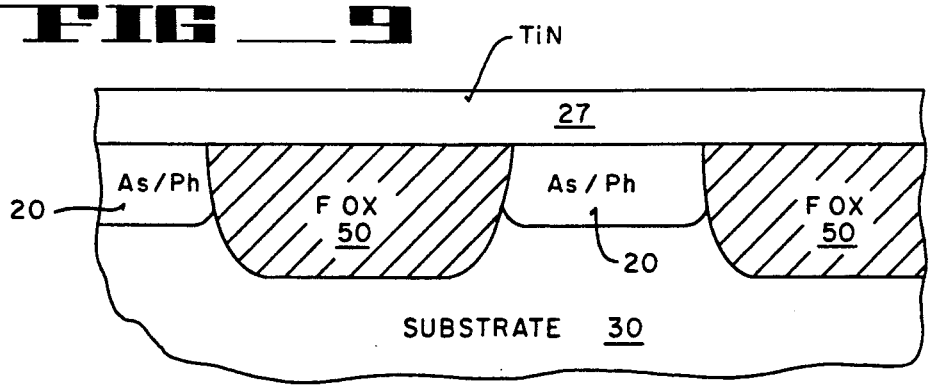
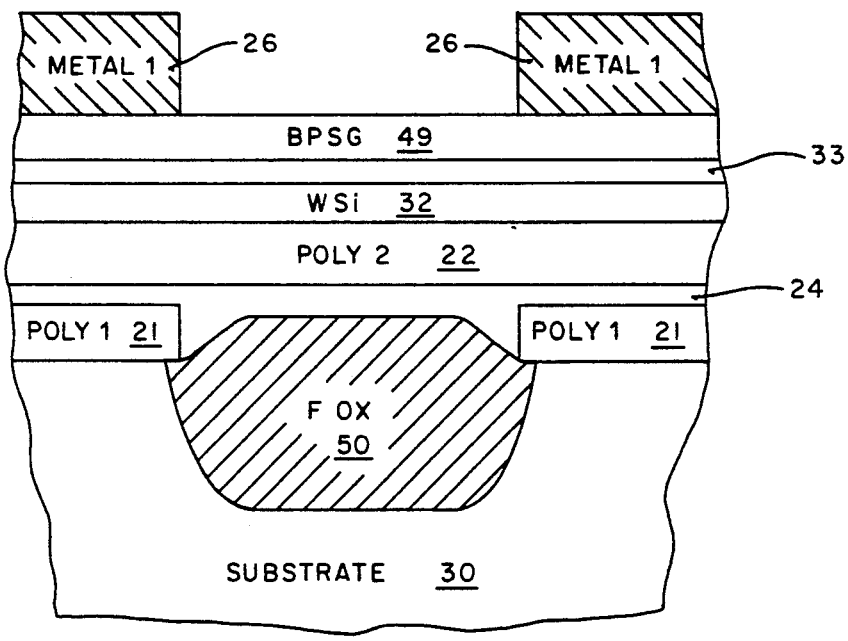
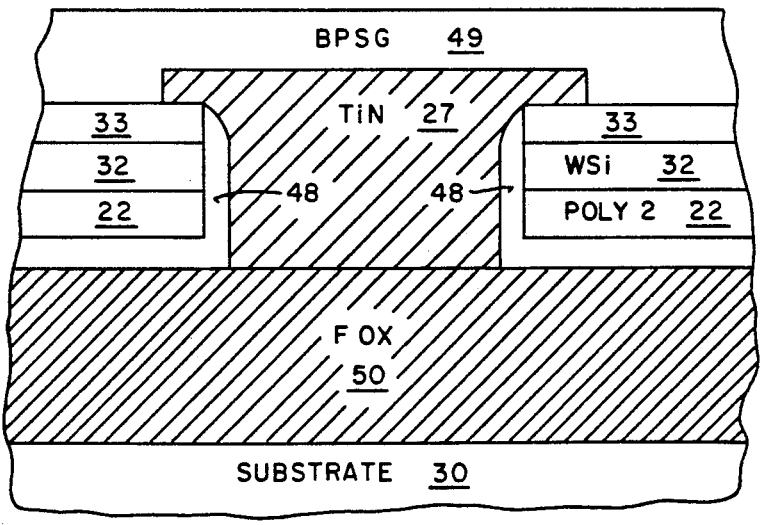

PROCESS FOR FABRICATING A FLASH EPROM HAVING REDUCED CELL SIZE

FIELD OF THE INVENTION

The present invention relates to the field of semiconductor memory devices employing floating gates and to their methods of fabrication. In particular, the invention relates to a method for fabricating an electrically erasable, electrically programmable read-only memory devices.

BACKGROUND OF THE INVENTION

Non-volatile semiconductor memory devices have been used extensively throughout the electronics industry for many years now. These cells typically employ floating gate devices in which a floating gate member is completely surrounded by an insulative layer such as silicon dioxide. Usually, a polycrystalline silicon (i.e., polysilicon) layer is used to form the floating gate members. Charge is transferred to the floating gate through a variety of mechanisms which include avalanche injection, channel injection, tunnelling, etc.

According to the operating principles of these devices, the charge on the floating gate affects the surface channel conductivity within the cell. If the conductivity is above a certain level, the cell is deemed to be programmed in one binary state, and if the conductivity is below another level, it is deemed to be programmed in the opposite binary state. Memory devices comprising arrays of such cells are referred to in the prior art as EPROMs or EEPROMs.

A type of non-volatile memory device, known as a flash EPROM or flash EEPROM, is one in which the entire array of cells can be erased simultaneously. That is, individual cells or groups of cells are not separately erasable as in ordinary EPROMs or EEPROMs. A flash EEPROM device is disclosed in co-pending application Ser. No. 07/253,775, filed Oct. 15, 1988, entitled "Low Voltage EEPROM Cell", which is assigned to the assignee of the present invention. U.S. Pat. Nos. 4,698,787 and 4,868,619 also disclose EEPROM devices fabricated to have an asymmetrical source/drain profile. Each of these prior art references discloses an electrically erasable programmable memory device which is programmed by hot-electron injection from the channel onto the floating gate and is erased by Fowler-Nordheim Tunnelling from the floating gate to the substrate.

In the past, EPROM and EEPROM cells have commonly been fabricated by initially defining active regions surrounded by field isolation regions. The field isolation is provided by means of relatively thick field oxide regions. Individual memory cells are then formed within these active regions. In the construction of a large memory array, it is conventional to form elongated, parallel source/drain regions which are sometimes referred to as bit lines. These elongated bit lines extend across the length of the array to provide electrical connection to columns of cells formed therebetween.

Running generally perpendicular to these bit lines are a plurality of polysilicon strips, frequently referred to as wordlines. Each of these polysilicon wordlines are coupled to the control gates within a single row of cells in the array. Together, the bit lines and wordlines provide a means for reading and writing information to individual memory cells.

One of the problems that arises in prior art processes is that, in order to form a continuous source or drain bit line within the substrate, selected portions of field oxide line must be removed from the surface of the substrate. Once removed, ordinary ion implantation steps are typically employed to properly dope the substrate and the regions where the bit lines are to be located. A very high etching selectivity is required between the field oxide and the underlying silicon substrate during the etching step which removes the field oxide. Overetching into the substrate damages the substrate surfaces in that region. A consequence of this type of surface damage is an erase distribution problem within the array. That is, certain cells erase at a much faster rate than other cells within the array. Of course, such variation in erase performance is undesirable.

It is also beneficial to reduce the overall dimension of the memory cell in order to increase the density of the memory array. Traditionally, one of the chief impediments to reducing cell size has been the contact-to-gate spacing requirements. In the past, a spacing of greater than 0.5 microns between the polysilicon control gate and the drain contacts has been required to guard against accidental shorts. This spacing requirement generally limited the overall achievable cell density. The minimum contact-to-gate spacing has also been limited in prior processes by the step coverage restrictions over the gate members.

As will be seen, the present invention discloses a process for fabricating flash EPROM devices which obviates the need to remove selected field oxide regions when forming elongated, buried bit lines within the array. The invented process is characterized by its highly self-aligned contact structure and by its novel use of titanium silicide and titanium nitride, among other materials, to form electrical conductors over field oxide regions.

Other prior art known to applicant include an article entitled, "Titanium Disilicide Self-Aligned Source/Drain+Gate Technology", by Lau et al., IEDM, 1982, which generally describes the use of titanium disilicide. Formation of titanium nitride films in a semiconductor process is also described generally in "LPCVD Titanium Nitride-Deposition, Properties, and Application to ULSI" by Pintchovski et al., Materials Research Society, 1989; "Microstructure and Electrical Properties of Titanium Nitride Diffusion Barrier Films Sputter from a Composite Target" by Wei et al., Materials Research Society, 1989; and "Titanium Nitride Deposition in a Cold Wall CVD Reactor" by A. Sherman, Materials Research Society, 1989. A trench-self-aligned isolation process technology for an EPROM memory cell structure is also described in an article entitled, "A 3.6 $\mu m^2$ Memory Cell Structure For 16MB EPROMS", by Hisamune et al., IEDM 1989, p. 583–586.

SUMMARY OF THE INVENTION

A process for fabricating an electrically programmable read-only device comprising an array of individual memory cells is disclosed.

In one embodiment of the invented process, a conventional recessed field oxidation processing sequence is first performed to form isolation regions between devices. After the isolation regions are created, a gate oxide is formed over the silicon substrate surface. Next, floating gate members are defined from a first polysilicon layer. These floating gate members comprise the storage elements for the individual memory cells in the device.

Following the formation of the floating gate members, a plurality of elongated, parallel, spaced-apart vertical stacks are formed over the floating gate members. Each of these stacks comprise a stratum of layers which includes a dielectric layer formed over the floating gate members and a second polysilicon layer which functions as the control gates for a row of memory cells. In the preferred embodiment, the second polysilicon wordlines are covered with a tungsten metal layer. Over this tungsten metal layer is deposited an insulative layer to isolate the stacks from the subsequent processing steps.

Forming the vertical stacks involves etching the stratum of layers down to the substrate such that corresponding openings are formed. Through these openings, dopants are implanted into the substrate to form the source and drain regions for the device. After ion implantation, sidewall insulation regions are formed on the vertical sides of the stacks. This fully insulates the floating gate members and polysilicon wordlines. The spaces between the stacks are then filled with a metal layer.

The metal layer filling the spaces or openings between the stacks is then patterned to form self-aligned contacts to the source and drain regions. Because the vertical stacks are completely insulated the contact pads for the drain and source regions are allowed to extend partially over the tops of the vertical stacks. This permits some misalignment of the subsequent metalization masking layers without adverse effects.

The same patterning step which forms the drain contact pads also forms an interconnect between adjacent common source regions. This means that the same metal used to fill the spaces over the source regions, also extends over the filled oxide regions between adjacent memory cells. This obviates the need to remove selected field oxide regions when forming bit lines in the array.

BRIEF DESCRIPTION OF THE DRAWINGS

The novel features believed characteristic of the invention are set forth in the appended Claims. The invention itself, however, as well as other features and advantages thereof, will be best understood by reference to the detailed description that follows, read in conjunction with the accompanying drawings, wherein:

FIG. 1 is a partial plan view of a portion of a prior art memory array used to illustrate a problem occurring with the prior art array.

FIG. 2 is a partial plan view of a portion of an array fabricated in accordance with the present invention.

FIG. 3 is a cross-sectional elevation view of a substrate after a stack of successively formed layers has been deposited over the surface. The layers include a first layer of polysilicon, an interpoly dielectric, a second polysilicon layer, a layer of tungsten silicide, and a silicon dioxide or, alternatively, a silicon nitride layer. This fabrication sequence is in accordance with the currently preferred embodiment of the present invention.

FIG. 4 illustrates the substrate of FIG. 3 following a selective etching of the stacked layers and an ion implantation step which forms the source and drain regions.

FIG. 5 illustrates the substrate of FIG. 4 following an additional ion implantation step into the source region.

FIG. 6 illustrates the substrate of FIG. 5 following the formation of sidewall oxide regions and titanium silicide source/drain contacts.

FIG. 7 illustrates the substrate of FIG. 6 following the formation of titanium nitride pads and straps. A first metalization layer for the array is also shown.

FIG. 8 is a perspective view of the substrate of FIG. 7 which illustrates the relative location of field oxide regions.

FIG. 9 is a cross-sectional cut view of the substrate of FIG. 2 taken along lines A—A'.

FIG. 10 is a cross-sectional cut view of the substrate of FIG. 2 taken along lines C—C'.

FIG. 11 is a cross-sectional cut view of the substrate of FIG. 2 taken along lines D—D'.

DETAILED DESCRIPTION

A process for fabricating an EEPROM memory device having reduced cell size is disclosed. In the following description, numerous specific details are set forth, such as doping levels, dimensions, materials types, etc., in order to provide a thorough understanding of the present invention. It will be obvious, however, to one skilled in the art that these specific details may not be needed in order to practice the present invention. In other instances, well-known processing steps have not been described in detail in order to avoid unnecessarily obscuring the present invention.

The memory cells of the present invention are fabricated using standard metal-oxide-semiconductor (MOS) processing. The array which contains the cells, in the currently preferred embodiment, is fabricated of n-channel devices. The peripheral circuitry can employ either n-channel devices or complimentary MOS (CMOS) devices.

In FIG. 1, there is shown a plain view of a portion of a prior art EEPROM memory array which comprises a common source region 15 shared by two adjacent cells. Each of the adjacent cells includes a drain region 14 and a drain contact 17. The channel region for each of the cells lies between the source and drain regions, directly below the polysilicon floating gate members 16 and wordlines 11. The channel is indicated in FIG. 1 by the cross-hatched regions 19, whereas polysilicon floating gate members 16 are shown to extend slightly beyond the edge of the channel in the direction of wordlines 11. Polysilicon floating gate members are typically formed from a first polysilicon layer.

In the fabrication of such a device, field-oxide regions 13 are formed early in the process sequence for the purpose of providing field isolation between adjacent devices. According the to present invention, just prior to the growth of the field oxide regions 13, a shallow trench is first etched into the substrate surface. Subsequently, these trenches are refilled with CVD oxide or polysilicon, thereby resulting in a shorter lateral encroachment into the active area of the device (i.e., a shorter "bird's beak"). Trenching also permits a greater percentage of the field oxide to be disposed below the surface of the substrate. In other words, initially etching a shallow trench into the regions where field oxide is to be grown causes the oxide layer to be more recessed into the silicon substrate. A recessed field oxide layer leads to greatly increased planarity throughout the remaining process steps. A planar surface is important to achieving high circuit densities.

The processing steps for forming the field oxide regions include initially growing a buffer oxide layer (~50 angstroms thick) followed by a layer of nitride (~1000 angstroms thick). The nitride and buffer oxide layers are then patterned to define the active areas of the devices. The exposed silicon substrate is then etched down to a depth of about 500–1000 angstroms to form shallow trenches. These trenches are refilled with CVD oxide or polysilicon to form the recessed field oxide regions. Ion implantation of boron is preferably done at this stage to create p-well regions. The implant is performed to a level of $5.0 \times 10^{12}$ atoms/cm$^2$ with an energy of 180 keV in the currently preferred embodiment.

After field oxidation, and formation of a gate oxide layer (see FIG. 3), a first layer of polysilicon (poly 1) is deposited over the silicon substrate. This poly 1 layer is plasma etched in general alignment with the active regions of the devices. Subsequently, wordlines 11 are fabricated from a second layer of polysilicon (poly 2). The first layer of polysilicon is then etched again in alignment with wordlines 11 to form the floating gates.

Note that floating gates 16 are disposed above the channel regions and beneath wordlines 11. Each of the floating gates 16 is electrically isolated; that is, each is completely surrounded by insulation (e.g., silicon dioxide).

As discussed earlier, one of the problems with the device of FIG. 1 is that field must be selectively removed in order to provide an opening for ion implantation to form the common buried source region 15. Often times, removal of the field oxide leads to performance problems with the array. Furthermore, the drain contact 17 to poly wordline 11 spacing requirement acts as a limitation on the density of cells within the array of FIG. 1.

With reference now to FIG. 2, there is shown a plain view of a portion of an array fabricated in accordance with the method of the present invention. In FIG. 2, the common source bit line 20 is connected over field oxide regions by means of a special metalized strap 27. Strap 27 "jumpers" or connects the source regions of adjacent cells to a referenc operating potential (e.g., $V_{SS}$). In the currently preferred embodiment of the present invention, this strap is formed by a layer of titanium nitride (TiN), although other materials (e.g., tungsten) could also be used. Thus, the use of strap 27 obviates the need for removal of field oxide regions to accommodate bit line 20. This aspect of the present invention will be discussed in more detail below.

FIG. 2 also illustrates wordlines 22 being formed substantially parallel across the array in one direction. Generally perpendicular to these wordlines 22 are metal 1 lines 26 which are used to contact the drains of the cells via drain contacts 25. Note that in accordance with the present invention the requirement for a drain contact-to-gate spacing is virtually eliminated. In other words, drain contact 25 is formed directly adjacent to polysilicon wordlines 22, without the need for a precautionary spacing. This later feature is made possible by the use of titanium nitride (TiN) pads 23. TiN pads 23 provide a self-aligned contact means for alleviating the contact to gate spacing requirement. In the currently preferred embodiment, drain contacts 25 are approximately 0.5 square microns, whereas TiN pads 23 are on the order of 0.7 square microns. As is shown in FIG. 2, pads 23 overlap the poly wordlines 22 by approximately 0.2 microns.

Referring now to FIG. 3, to arrive at the structure of FIG. 2 field oxide is first formed over substrate 30 as described above. Next, gate oxide is grown over p-type substrate 30. The tunnel or gate oxide is shown in FIG. 3 by layer 29. A channel implant (or implants) is normally performed to adjust the cell threshold voltage. Next, a first polysilicon layer 21 is deposited over the gate oxide. (Note that the gate oxide is not shown in subsequent FIGS. 4–11 for reasons of clarity). As discussed previously, the first polysilicon layer eventually forms the floating gates of the cells in the array.

Once the first polysilicon layer has been deposited, an interpoly dielectric layer 24 is formed. Typically, dielectric layer 24 comprises a composite oxide including silicon dioxide, silicon nitride, and silicon dioxide. This type of composite dielectric is frequently referred to as ONO. Alternatively, ordinary silicon dioxide may be used.

A second polysilicon layer 22 is then deposited over dielectric layer 24. Layer 22 forms the control gates of the devices within the array. Next, a layer of tungsten silicide 32 (WSi) is deposited over poly layer 22. The tungsten silicide layer is included to increase the conductivity of the wordlines. On top of layer 32, a low temperature deposited oxide (LTO) or silicon nitride layer 33 is deposited. This layer is shown as layer 33 which provides insulation for the underlying conductive layers, (i.e., layers 22 and 32).

Collectively, layers 22, 32 comprise the wordlines in the array. (Note that in FIG. 2, the second layer polysilicon (poly 2) wordlines are indicated solely by the reference number 22. To simplify the discussion of the remaining FIGS. 4–11, the reference numeral 22 should be understood as denoting the presence of the additional layer 32.)

After poly layer 21 has been deposited, it is etched to form elongated, parallel, spaced-apart strips. Following the formation of the stack shown in FIG. 3, another etching step is performed to define the wordlines in the array. This step etches through the low temperature oxide/nitride layer 33, tungsten silicide layer 32, second polysilicon layer 22, interpoly dielectric layer 24 and first polysilicon layer 21. Thus, this is a self-aligned etch which forms a plurality of separate vertical stacks, each stack comprising a stratum of the above-mentioned layers. With the exception of first polysilicon layer 21 (which is confined above the channel regions of the cells after the vertical etch step) the etched stacks comprise the wordlines 22 shown in FIG. 2.

FIG. 4 is a cross-sectional elevation view of the array of FIG. 2 taken along cut lines b—b'. The view of FIG. 4 illustrates the silicon substrate 30 following etching of the vertical stacks and an ion implantation step. As is clearly shown, each of the wordline stacks 36 comprise a stratum of polysilicon layers 21, 22, interpoly dielectric layer 24, tungsten silicide layer 32 and LTO or silicon nitride layer 33. Also shown is resist layer 34 which has been deposited and patterned in accordance with the above-mentioned etching step.

After etching has been completed, an arsenic implant is performed as indicated by arrows 37 in FIG. 4. In the currently preferred embodiment, arsenic is implanted to a level of $1-4 \times 10^{15}$ atoms/cm$^2$ with an energy of 20–40 keV. This forms elongated, spaced-apart, doped regions 39 and 38 in substrate 30.

Next, as illustrated in FIG. 5, exposed regions 39 are covered with photoresist member 43. (Note that photoresist members 34 are removed prior to this occurring.) At this point, regions 39 are protected while regions 38 remain exposed. An ion implantation step is then performed which implants the source region with a different n-type dopant. Currently, phosphorous is implanted to a level of approximately $2-8 \times 10^{15}$ atoms/cm$^2$ at an energy of 20–40 keV. This is indicated in FIG. 5 by arrows 41. It should be understood that ion implants 37 and 41 create source and drain regions which are self-aligned to stacks 36 in accordance with the present invention. This insures that the source and drain regions are precisely aligned to polysilicon layers 21 and 22, which make up the floating and control gates of the cells.

Following implant 41, the substrate is subjected to high temperature oxidation. This forms relatively thick reoxidation (i.e., "reox") regions laterally along the poly 2 gate to ensure good charge retention characteristics for the cell. In the preferred embodiment, this oxidation step is performed at approximately 850° C. The thickness of the reox produced for this step is approximately 500 angstroms thick (disposed along the gate edge as well as on top of the source and drain regions). The thickness of first and second polysilicon layers 21 and 22 are approximately 1000 angstroms and 1500 angstroms, respectively. Tungsten silicide layer 32 is preferably formed to a thickness of approximately 2000 angstroms and LTO or nitride layer 33 has a thickness in the range of 1000–1500 angstroms. Note that layer 33 prevents the formation of oxide on stacks 36 during the reox growth steps.

The high temperature oxidation step which forms the field oxide regions also activates the arsenic and phosphorous dopants previously implanted into substrate 30. Thus, source region 20 and drain region 40 are created as shown in FIG. 6. Source region 20 is shown being deeper when compared to drain region 40 because the phosphorous dopant diffuses more quickly into the silicon than arsenic. Hence, these regions are inherently deeper. The phosphorous dopant also produces a more graded junction relative to the shallow drain region 40. That is, the dopant gradient associated with the source region is more gradual than that associated with the drain region. The relatively high diffusivity of phosphorous also produces a larger overlap between source 20 and floating gate 21. This overlap is useful during erase operations wherein electrons tunnel from floating gate 21 to source 20 through the thin gate oxide in the overlap region.

After high temperature oxidation, spacer oxide or nitride regions 48 are formed along the sidewall portions of stacks 36. Spacer oxide regions 48 prevents shorts from occurring from metal to either of polysilicon layers 21 or 22. Regions 48 are formed according to the well-known TEOS or nitride processes to a thickness of approximately 500 angstroms. After spacer etching, the LTO or nitride on tip of the poly stack should preferably have more than about 500 angstroms remaining.

Once spacer oxide regions 48 have been formed, titanium is sputtered over the wafer surface. Before the sputtering of the titanium, a wet dip is used to remove any oxide remaining on the source/drain regions. A subsequent annealing step forms titanium silicide (TiSi$_2$) in source and drain regions 20 and 40, respectively. The titanium silicide regions are shown in FIG. 6 by cross-hatched regions 42. Prior to the sputtering process, the only exposed areas of the silicon substrate are the source/drain regions. This means that titanium silicide only forms in these regions. In the remaining areas, the sputtered titanium or titanium nitride is removed from the surface of the substrate by a dip in a chemical etchant.

Of course, the dip only removes titanium in those areas where titanium silicide has not been formed, i.e., everywhere except in the source/drain contact regions).

Referring now to FIG. 7, after titanium silicide regions 42 have been formed, titanium nitride is deposited over the wafer surface. This titanium nitride deposition fills each of the spacings which comprise the contact openings to the source and drain regions between stacks 36 (about 0.4 to 0.5 microns wide in the preferred embodiment). The thickness of the titanium nitride layer extends to approximately 2000–3000 angstroms above the upper surface of layer 33. This titanium nitride layer is then patterned and etched to define drain contact pads 23 and V$_{SS}$ straps 27. Alternatively, an adhesion layer of titanium nitride can be utilized followed by a layer of tungsten.

Titanium nitride is preferably deposited using a chemical vapor deposition technique known as LPCVD. Etching of the titanium nitride layer to form pads 23 and via straps 27 can be performed using either a dry or wet etching technique. Once pads 23 and straps 27 have been formed, the surface of the substrate is substantially planarized (see FIG. 8).

After deposition and patterning of the titanium nitride layer, a layer of boro-phospho-silicon-glass (BPSG) 49 is formed over the surface of the substrate using conventional LPCVD methods. Contact drain openings 25 are formed using standard photolithographic masking steps and a first metal layer 26 is then deposited and patterned to form an interconnect network for the integrated circuit. By way of example, FIG. 2 illustrates a pair of first metal traces connected to drain contacts 25.

It should be appreciated that forming pads 23 and strap 27 with a single masking step provides considerable advantages over the prior art. By way of example, the titanium nitride pads 23 provides self-aligned contacts to underlying drain regions 40. Note that the drain contact opening 25 can be located anywhere over the upper surface of pad 23. In certain instances, opening 25 can also be overlapping onto adjacent LTO or nitride regions 33 without incurring adverse device performance. Thus, the use of pads 23 makes the invented process highly tolerant to misalignment errors of the contact mask.

Moreover, the step height coverage problem of prior art processes is no longer a factor with the invented process because the formation of titanium nitride pads 23 and straps 27 renders a highly planarized substrate surface. The use of pads 23 also minimizes the cell size since the drain contact-to-gate spacing constraint has been eliminated. Overall, a 50% cell size reduction has been realized over conventional EEPROM cell designs in accordance with the present invention.

Assisting in the reduction of cell size is the use of V$_{SS}$ straps 27 which provide a connection between adjacent source regions 20 across underlying field oxide regions 50. This aspect of the present invention is illustrated in FIG. 8. FIG. 8 shows a perspective view of the substrate following patterning of titanium nitride regions 23 and 27, just prior to deposition of BPSG layer 49. In effect, V$_{SS}$ straps 27 provide a "jumpered" electrical connection between adjacent diffused common source regions 20.

It should be understood that according to the present invention, a common source bit line is realized by the jumpered connections. Note, however, that the bit line itself is not entirely "buried" as in the prior art. Only the source diffusions associated with individual cells are "buried" within the substrate; the connections between the sources are achieved through the use of $V_{SS}$ straps 27

Note also that the titanium nitride could be substituted with other metals such as tungsten, titanium, or other titanium alloys. The essential requirement is that the pad and strap metal provide a conformal deposition which fills the contact spaces between the wordline polysilicon stacks. Moreover, in certain alternative embodiments the titanium layer may be thickened and patterned to provide an interconnect system which obviates the need for metalized layer 26.

FIG. 9 illustrates a cross-sectional view of the memory array shown in FIG. 2 taken along cut lines A—A'. This view shows the jumpering of common source regions 20 via titanium nitride strap 27. Within the array, source regions associated with individual cells are completely surrounded by field oxide regions 50. The source regions 20 are interconnected via titanium nitride straps 27 which are coupled to the source diffusions through titanium silicide contacts 42. In this way, a common source bit line 20 can be formed as a single column line within the EEPROM array.

FIG. 10 illustrates a cross-sectional view of the memory device of FIG. 2 taken along cut lines C—C'. This view is taken laterally along the polysilicon wordline comprising polysilicon layer 22, tungsten silicide layer 32 and LTO/nitride layer 33. Covering layer 33 is BPSG layer 49, followed by metal 1 conductors 26. Note that wordline 22 traverses field oxide regions 50 to provide connection to the control gates of all cells within a row of the EEPROM array. The floating gates of individual cells are formed by first polysilicon layer 21 which is confined over the channel region of the memory cells.

FIG. 11 shows yet another cross-sectional view of the EEPROM device of FIG. 2 taken along the cut lines D—D'. This view illustrates the VSS strap 27 running parallel to adjacent wordlines 22. As can be seen, titanium nitride strap 27 is insulated from the wordlines of the array (comprised of polysilicon layer 22 and tungsten silicide layer 32) by sidewall oxide regions 48. Titanium nitride strap 27 is also insulated above by BPSG layer 49 everywhere except at those locations where via openings are formed. These via openings provide a means of making electrical connection to subsequently deposited metal interconnection layers.

Although the present invention has been described by way of certain specific embodiments, it is appreciated that the novel features of the invention may be incorporated into a variety of process flows. Therefore, it is to be understood that the particular embodiments shown and described by way of illustration are in on way intended to be considered limiting. Reference to the details of the preferred embodiment is not intended to limit the scope of the claims, which themselves recite only those features regarded as essential to the invention.

What is claimed is:

1. A method of fabricating an electrical programmable read-only memory device in a silicon substrate, said device comprising an array of memory cells, said method comprising the steps of:
   (a) forming a gate oxide over said substrate;
   (b) forming floating gate members for each of said cells over said gates oxides;
   (c) forming a plurality of elongated, parallel, spaced-apart vertical stacks over said floating gate members,
   each of said stacks comprising a polysilicon wordline, said polysilicon wordline being insulated from said floating gate members by a dielectric layer;
   (d) implanting a first dopant into said substrate in the spaces separating said stacks from one another to form source and drain regions within said substrate wherein adjacent source regions are electrically isolated from one another;
   (e) forming sidewall insulative layers on said stacks;
   (f) filling said spaces with a metal layer;
   (g) patterning said metal layer to form self-aligned contacts to said source and drain regions, said patterning step also forming electrical interconnects between said adjacent source regions, said interconnects extending between adjacent memory cells.

2. The method of claim 1 further comprising the steps of:
   forming a low resistance silicide layer over said polysilicon wordlines; and
   depositing and insulative layer over said silicide layer.

3. The method of claim 2 further comprising the initial steps of:
   etching trenches into said substrate; and
   growing field oxide regions in said trenches, said field oxide regions being substantially recessed below said substrate surface.

4. The method of claim 3 further comprising the step, after said implanting step, of:
   additionally implanting said source regions with a second dopant to form a deeper, more graded junction as compared to said drain regions.

5. The method according to claim 4 wherein said first dopant comprises arsenic, and said second dopant comprises phosphorous.

6. The method according to claim 3 wherein said metal layer is selected from the group consisting essentially of titanium, titanium nitride, and tungsten.

7. The method of claim 6 wherein said interconnects are formed as elongated, parallel, spaced-apart strips disposed generally perpendicular to said vertical stacks.

8. The method of claim 7 wherein said spaces are filled conformably such that the top of said metal layer is substantially coplanar to the top of said vertical stacks.

9. The method of claim 8 wherein said low resistance silicide layer comprises tungsten silicide.

10. The method of claim 9 wherein said interconnects extend across said field oxide regions.

11. A method of fabricating an electrically programmable read-only memory device in a silicon substrate comprising the steps of:
    etching trenches into the surface of said substrate;
    selectively oxidizing said substrate to form isolation regions within said trenches, said isolation regions being disposed generally beneath said substrate surface;
    forming a gate oxide over said substrate;
    covering said gate oxide successively with a first polysilicon layer, an interpoly dielectric, and a second polysilicon layer;
    depositing a first metal layer over said second polysilicon layer;

depositing an insulative layer over said first metal layer;

patterning a masking layer to form elongated, parallel, spaced-apart openings;

vertically etching through said openings down to said substrate, thereby forming elongated, parallel spaced-apart wordline stacks;

introducing dopants into said substrate through said openings to form source and drain regions wherein adjacent source regions are electrically isolated from one another;

forming sidewall insulative regions along said wordline stacks;

depositing a second metal layer over said substrate, said second metal layer filling said openings;

patterning said second metal layer to form self-aligned contacts to said source and drain regions, wherein said patterning step also forms electrical interconnects between said adjacent source regions, said interconnects extending across said isolation regions.

12. The method of claim 11 wherein said interconnects are formed as elongated, parallel, space-apart strips disposed generally perpendicular to said wordline stacks.

13. The method of claim 12 wherein after covering said gate oxide with said first polysilicon layer, said first polysilicon layer is etched to form a plurality of floating gate members for said device.

14. The method of claim 13 wherein said openings are filled conformably such that the top of said second metal layer is substantially coplanar with the top of said wordline stacks.

15. The method of claim 14 wherein the step of depositing said second metal layer comprises the steps of:
sputtering titanium into said openings;
annealing said substrate to form titanium silicide in said source and drain regions; and
filling said openings with said second metal layer.

16. The method of claim 15 wherein said second metal layer is selected from the group consisting essentially of titanium, titanium nitride, and tungsten.

* * * * *

UNITED STATES PATENT AND TRADEMARK OFFICE
CERTIFICATE OF CORRECTION

PATENT NO. : 5,210,047
DATED : 5/11/93
INVENTOR(S) : Been-Jon K. Woo et al

It is certified that error appears in the above-indentified patent and that said Letters Patent is hereby corrected as shown below:

| | | |
|---|---|---|
| Col. 4, Line 11 | Delete "A-A' " | Insert -- 3-3'-- |
| Col. 4, Line 13 | Delete "C-C' " | Insert -- 1-1'-- |
| Col. 4, Line 15 | Delete "D-D' " | Insert --4-4'-- |
| Col 5, Line 26 | After the word "field" | Insert --oxide-- |
| Col. 6, Line 48 | Delete "b-b' " | Insert --2-2'-- |
| Col. 9, Line 15 | Delete "A-A' " | Insert --3-3'-- |
| Col. 9, Line 26 | Delete "C-C' " | Insert --1-1'-- |
| Col. 9, Line 39 | Delete "D-D' " | Insert --4-4'-- |

Signed and Sealed this

Fifth Day of April, 1994

Attest:

BRUCE LEHMAN

*Attesting Officer*   Commissioner of Patents and Trademarks